United States Patent
Vanderhallen

(10) Patent No.: US 12,426,145 B2
(45) Date of Patent: Sep. 23, 2025

(54) CONNECTION ASSEMBLY

(71) Applicant: ASML Netherlands B.V., Veldhoven (NL)

(72) Inventor: Ivo Vanderhallen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 134 days.

(21) Appl. No.: 18/550,841

(22) PCT Filed: Feb. 21, 2022

(86) PCT No.: PCT/EP2022/054228
§ 371 (c)(1),
(2) Date: Sep. 15, 2023

(87) PCT Pub. No.: WO2022/199959
PCT Pub. Date: Sep. 29, 2022

(65) Prior Publication Data
US 2024/0196504 A1    Jun. 13, 2024

(30) Foreign Application Priority Data
Mar. 25, 2021 (EP) .................................... 21164821

(51) Int. Cl.
*G03F 7/00* (2006.01)
*H05G 2/00* (2006.01)

(52) U.S. Cl.
CPC ......... *H05G 2/002* (2024.08); *G03F 7/70033* (2013.01); *G03F 7/70808* (2013.01)

(58) Field of Classification Search
CPC ............. G03F 7/70033; G03F 7/70808; G03F 7/70891; H05G 2/005; H05G 2/006; H05G 2/008
See application file for complete search history.

(56) References Cited

U.S. PATENT DOCUMENTS

| 2014/0261761 A1 | 9/2014 | Vaschenko et al. |
| 2019/0086817 A1 | 3/2019 | Bessems et al. |

FOREIGN PATENT DOCUMENTS

| CN | 118435062 A * | 8/2024 | ............ G01P 13/006 |
| EP | 1 389 685 A2 | 2/2004 | |

(Continued)

OTHER PUBLICATIONS

International Search Report and Written Opinion of the International Searching Authority directed to International Patent Application No. PCT/EP2022/054228, mailed Jun. 7, 2022; 11 pages.

(Continued)

*Primary Examiner* — Peter B Kim
(74) *Attorney, Agent, or Firm* — Sterne, Kessler, Goldstein &Fox P.L.L.C.

(57) ABSTRACT

There is described a connection assembly (24) for a high-pressure liquid metal supply system used in an EUV light source comprising a monolithic block, wherein the monolithic block includes: at least one connection (21) for connecting to a reservoir (18,19) configured to hold liquid metal; interior passages (25) configured to fluidly connect the at least one connection with at least two liquid metal outlets/inlets (22, 23); at least two freeze valves (15,16,17) configured to block a passage by solidifying liquid metal therein. Also described is a liquid metal storage assembly including such a connection assembly, a lithography apparatus including such a liquid metal storage assembly or such a connection assembly, as well as the use of such assemblies or apparatus in a lithographic apparatus or method.

14 Claims, 3 Drawing Sheets

(56) References Cited

FOREIGN PATENT DOCUMENTS

| EP | 1 854 121 A1 | 11/2007 |
|----|--------------|---------|
| GB | 2 384 327 A | 7/2003 |
| WO | WO 2020/187617 A1 | 9/2020 |

OTHER PUBLICATIONS

International Preliminary Report on Patentability directed to International Patent Application No. PCT/EP2022/054228, issued Sep. 12, 2023; 7 pages.
"Semiconductor Processing Equipment," Research Disclosure No. 672035, Mar. 7, 2020; 9 pages.
"Semiconductor Processing Equipment," Research Disclosure No. 652053, Jul. 17, 2018; 7 pages.

\* cited by examiner

CONNECTION ASSEMBLY

CROSS-REFERENCE TO RELATED APPLICATIONS

This application claims priority of EP/US application 21164821.7 which was filed on Mar. 25, 2021 and which is incorporated herein in its entirety by reference

FIELD

The present invention relates to a connection assembly for a high-pressure liquid metal supply system used in an EUV light source, a liquid metal storage assembly for an EUV lithography apparatus, a lithography apparatus including such a connection assembly or liquid metal storage assembly, as well as the use of such assemblies or apparatus in a lithographic source, apparatus, or method.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The substrate, which may also be referred to as a wafer, is supported within the lithographic apparatus by a wafer table.

Certain lithographic apparatuses which use EUV radiation create the radiation beam by illuminating droplets of a target material with a laser. The EUV Source creating such radiation is sometimes referred to as Laser Produced Plasma source. The laser converts the target material into a plasma, which subsequently releases EUV radiation, which can be collected and formed into a radiation beam. The droplets of target material are generated by a droplet generator assembly, which is supplied with the target material from a target material storage assembly. Due to the relatively high pressures of target material and the nature of the liquid target material itself, there is a risk of leakage of the liquid target material.

The present invention has been provided with a view to addressing at least some of the drawbacks of existing systems.

SUMMARY

According to a first aspect of the present invention, there is provided a connection assembly for a high-pressure liquid metal supply system used in an EUV light source comprising a monolithic block, wherein the monolithic block includes: at least one connection for connecting to a tank configured to hold liquid metal; interior passages configured to fluidly connect the at least one connection with at least two liquid metal outlets/inlets; at least two freeze valves configured to block a passage by solidifying liquid metal therein.

The present invention provides a monolithic connection assembly in which the interior passages and freeze valves are formed from a monolithic block. In other assemblies, the freeze valves are separately formed from the pipes which transfer the liquid metal. For examples, there may be two freeze valves and three separately formed pipes connecting to the freeze valves. The separately formed pipes need to be connected to the separate freeze valves. However, it has been found that after repeated use, the connections between the pipes and the freeze valves can become cracked, and may therefore allow leakage of the liquid metal within. In existing systems, the pipes have a degree of flexibility to allow the different components to be fitted together. In addition, the material from which the pipes are made needs to be stable to exposure to liquid metal, in particular liquid tin. As such, the pipes are formed from a tantalum alloy. Whilst this tantalum alloy is stable to exposure to liquid metal, in particular liquid tin, it is susceptible to oxygen embrittlement. This is causes by oxygen entering the tantalum alloy and causing the tantalum alloy to be more brittle. Since the tantalum alloy is heated to above the melting point of tin, the rate at which the embrittlement occurs is greater than it would be at ambient temperatures. Furthermore, the transfer pipes of existing designs are very thin and so are difficult to handle and manufacture. On the other hand, with the present invention, since the interior passages are formed from a monolithic block, it is easier to manufacture them and there is no assembly required and so there is no risk of any pipes becoming kinked or otherwise damaged. In addition, the present invention avoids the need to weld tantalum alloy, which requires an inert protective atmosphere.

The assembly according to the present invention dramatically simplifies the construction of the assembly as compared to other systems as it comprises a single piece rather than multiple separate pieces. In addition, since the freeze valves and interior passages are formed as a monolithic block, there are no connections or joints between components to crack or which can leak. Indeed, with the assembly of the present invention, far fewer joints or connections need to be provided in contrast to existing systems where there are upwards of eight joints or connections, each of which may be subject to leakage. The present invention also removes the need to have gaskets between the connections or joints between the transfer pipes and the freeze valves. The material of the gaskets can break down and can even evaporate over time, which can lead to leaks. In addition, with existing systems, there is a risk of rupture of the lines if the apparatus is heated or cooled in an incorrect order since the liquid metal expands when it melts, if the metal within a transfer pipe is melted whilst the associated freeze valves are kept closed, the pressure within the transfer pipes can increase and may lead to rupture of the lines or leakage at the joints or connections between the separately formed pipes and freeze valves. The present invention provides for an essentially leak-proof connection assembly which is easier to work with and is less susceptible to damage. As described herein, the liquid metal is preferably tin. The connection assembly includes interior passages which are configured to connect the at least one connection with at least two liquid metal inlets/outlets. In this way, the connection assembly is configured to transfer liquid metal between a liquid metal reservoir and the at least two liquid metal outlets/inlets. One of the at least two liquid metal outlets/inlets may be for the receipt of liquid tin from a tin priming assembly and the other may be for discharging liquid tin to a droplet generator assembly. As such, the at least two liquid metal outlets/inlets serve as entry and/or exit points for liquid metal, and allow liquid metal to be transferred to and from a liquid metal reservoir via the connection assembly.

The assembly may include one or more thermal conditioning elements in thermal connection with the freeze valves. The one or more thermal conditioning elements may include one or more cooling elements. Additionally or alternatively, the one or more thermal conditioning elements may include one or more heating elements. The opening and closing of freeze valves is controlled by controlling the solidification and melting of metal contain therein. When the freeze valve is to be opened, it is heated to above the melting point of the metal therein such that the metal melts and is able to flow through the valve. On the other hand, when the freeze valve is to be closed, it is cooled to below the melting point of the metal therein, which solidifies and forms a plug which prevents fluid flow. The invention is not particularly limited by the exact heating or cooling means used and any means which is able to provide the required degree of heating and/or cooling may be used. In one example, the heating means includes at least one heater. The heater may include a rod heater, a plate heater, a heating wire, or indeed any other suitable heater. In an example, the cooling means includes a water cooling circuit. By constructing the assembly as a monolithic block, the conditioning elements can be attached more easily than is the case with existing systems.

The assembly may comprise one or more controllers configured to control the one or more thermal conditioning elements to selectively open or close the freeze valves. The one or more controllers may be configured to independently and separately control the freeze valves. In this way the opening and closing of the freeze valves can be controlled to allow or prevent fluid flow within the assembly.

The one or more thermal conditioning elements may be configured to locally cool each freeze valve to below the melting point of the metal, preferably tin, therein. The one or more thermal conditioning elements may be configured to locally heat each freeze valve to above the melting point of the metal, preferably tin, therein.

The assembly may be configured to operate at pressures of up to around 30 kpsi, up to around 25 kpsi, up to around 20 kpsi, up to around 15 kpsi, up to around 10 kpsi, up to around 5 kpsi. The assembly is preferably configured to operate at pressures of at least around 3 kpsi, at least around 4 kpsi, or at least around 5 kpsi. A liquid tin supply system typically is operated under high pressure as this is required to provide the tin droplets which are illuminated by a laser beam to generate EUV radiation with sufficient speed. By forming the assembly as a monolith, it is possible for the assembly to withstand higher pressures than would otherwise be the case. In cases where the liquid metal is transferred via pipes, due to the small volumes of liquid metal being transferred, the outer diameter is only a few millimetres and the inner diameter is of the order of one millimetre. It is therefore difficult and costly to manufacture such pipes. In contrast, the present invention allows for the transfer conduits to be formed via drilling.

Each freeze valve may be at least partially thermally isolated from the other freeze valve(s). Each freeze valve may be at least partially isolated from the other freeze valve(s) by a section of the block having a decreased cross-sectional area. Although the freeze valves are all formed in the same monolithic block and are therefore ultimately in thermal connection with one another, it is still possible to individually control the opening and closing of the freeze valves. Whilst this may be achieved by way of the conditioning elements, it has been found that separating the freeze valves from one another by areas of the monolithic block having a decreased cross-section can assist is controlling the transfer of thermal energy from one freeze valve to another. In embodiments, the freeze valves may include a passage of reduced cross-sectional area as compared to the cross-sectional area of the interior passages.

The assembly may include a first one of the at least two freeze valves is in fluid communication with one of the at least two liquid metal outlets/inlets configured to receive liquid metal, the first freeze valve being in fluid communication with the at least one connection for connecting to a reservoir configured to hold liquid metal, and the first freeze valve also being in fluid communication with a second one of the at least two freeze valves. The liquid metal may be received from any suitable source. In an example, the liquid metal is from a priming system configured to produce fluid target material from a solid matter with low contamination particles. The liquid metal may be filtered to remove unwanted tin oxide particles. The liquid metal may be tin.

The assembly may include a second one of the at least two freeze valves in fluid communication with the at least one connection configured to connect to a first liquid metal reservoir, a first of the at least two freeze valves, an optional third freeze valve, and one of the at least two liquid metal outlets/inlets configured to discharge liquid metal. The outlet configured to discharge liquid tin may be connected to a droplet generator assembly which is configured to generate droplets of liquid metal. The droplets of liquid metal can then be illuminated with a laser to ultimately provide a radiation beam having the required wavelength.

The assembly may include a third freeze valve in fluid communication with a second one of the at least two freeze valves, in fluid communication with a connection configured to connect to a second liquid metal reservoir, and in communication with an outlet of the at least two liquid metal outlets/inlets configured to discharge liquid metal.

The assembly may be formed from a material which is resistant to liquid tin. The assembly may be formed from molybdenum or a molybdenum alloy. Molybdenum is able to withstand exposure to liquid tin and does not suffer from oxygen embrittlement. Alternatively, the assembly may be formed from stainless steel with a protective layer, such as a hard-inchromized layer or a boronized layer.

The connection assembly may be formed by additive manufacturing. Additive manufacturing, also known as 3D printing, allows for the creation of a monolithic block with an internal structure comprising conduits for liquid metal to flow through and freeze valves. The internal features of the connection assembly, such as the freeze valves or the fluid connections, may be formed from a billet. The internal features may be created by drilling.

According to a second aspect of the present invention, there is provided a liquid metal supply assembly for an EUV lithography apparatus or source including the assembly according to the first aspect of the present invention.

The liquid metal storage assembly may include a primary reservoir and a refill reservoir. The primary reservoir and the refill reservoir are configured to contain a liquid metal, preferably liquid tin. The reservoirs may be configured to be pressurised by a gas, such as forming gas comprising argon and hydrogen. The reservoirs may be pressurised such that the liquid metal contained therein is discharged through the connection assembly to provide liquid metal to a droplet generator assembly. The reservoirs may also be configured to be refilled with liquid metal via the connection assembly of the present invention.

According to a third aspect of the present invention, there is provided a lithography apparatus, preferably an EUV lithography apparatus, including an assembly according to the first or second aspects of the present invention.

According to a fourth aspect of the present invention, there is provided the use of an assembly or apparatus according to any of the first, second, or third aspects of the present invention in a lithographic apparatus or method.

The features of any aspect of the present invention may be combined except where the features are mutually incompatible and all such combinations are explicitly considered and disclosed.

BRIEF DESCRIPTION OF THE DRAWINGS

Embodiments of the invention will now be described, by way of example only, with reference to the accompanying schematic drawings, in which.

DETAILED DESCRIPTION

Figure 1:
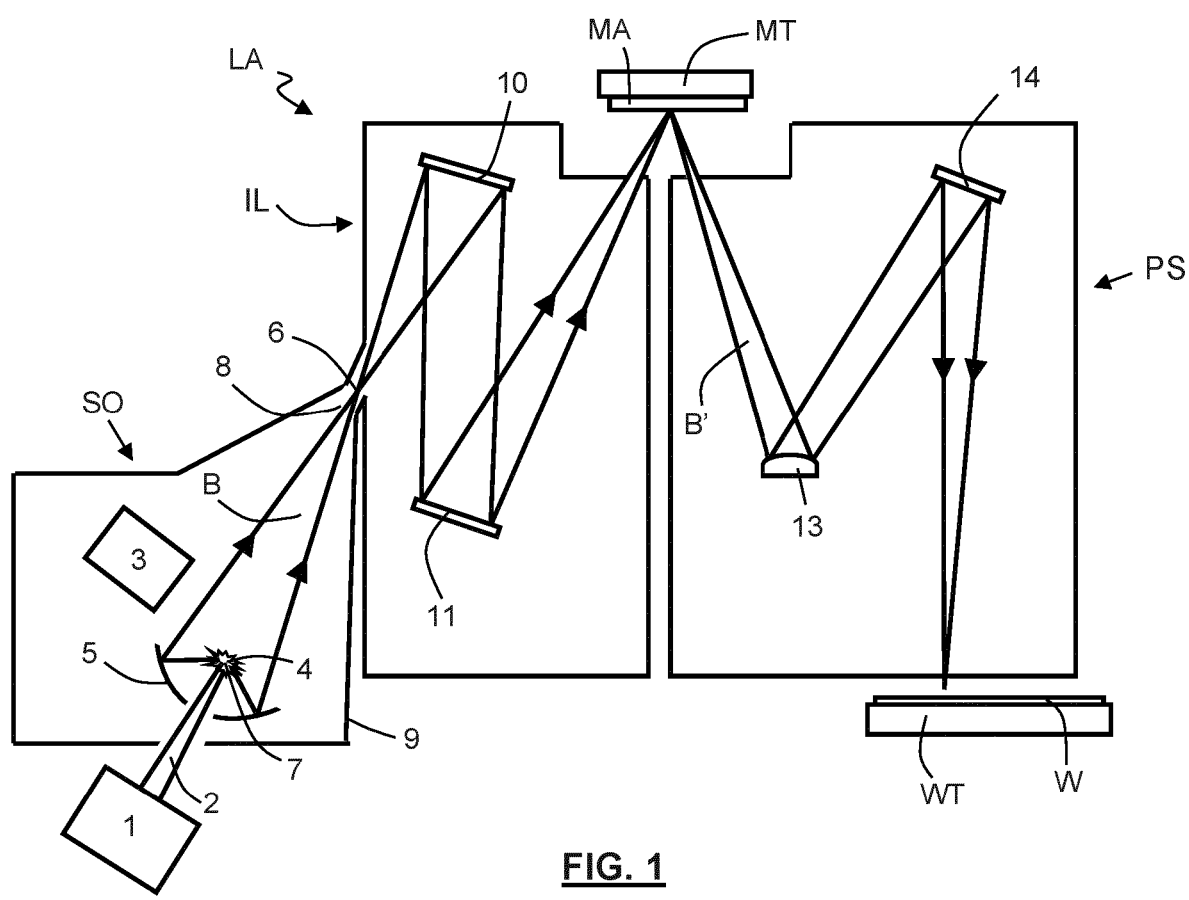
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma. The fuel emitter 3 may be part of a droplet generator assembly (not shown). The droplet generator assembly may be supplied with liquid tin via the connection assembly according to the present invention.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Figure 2:
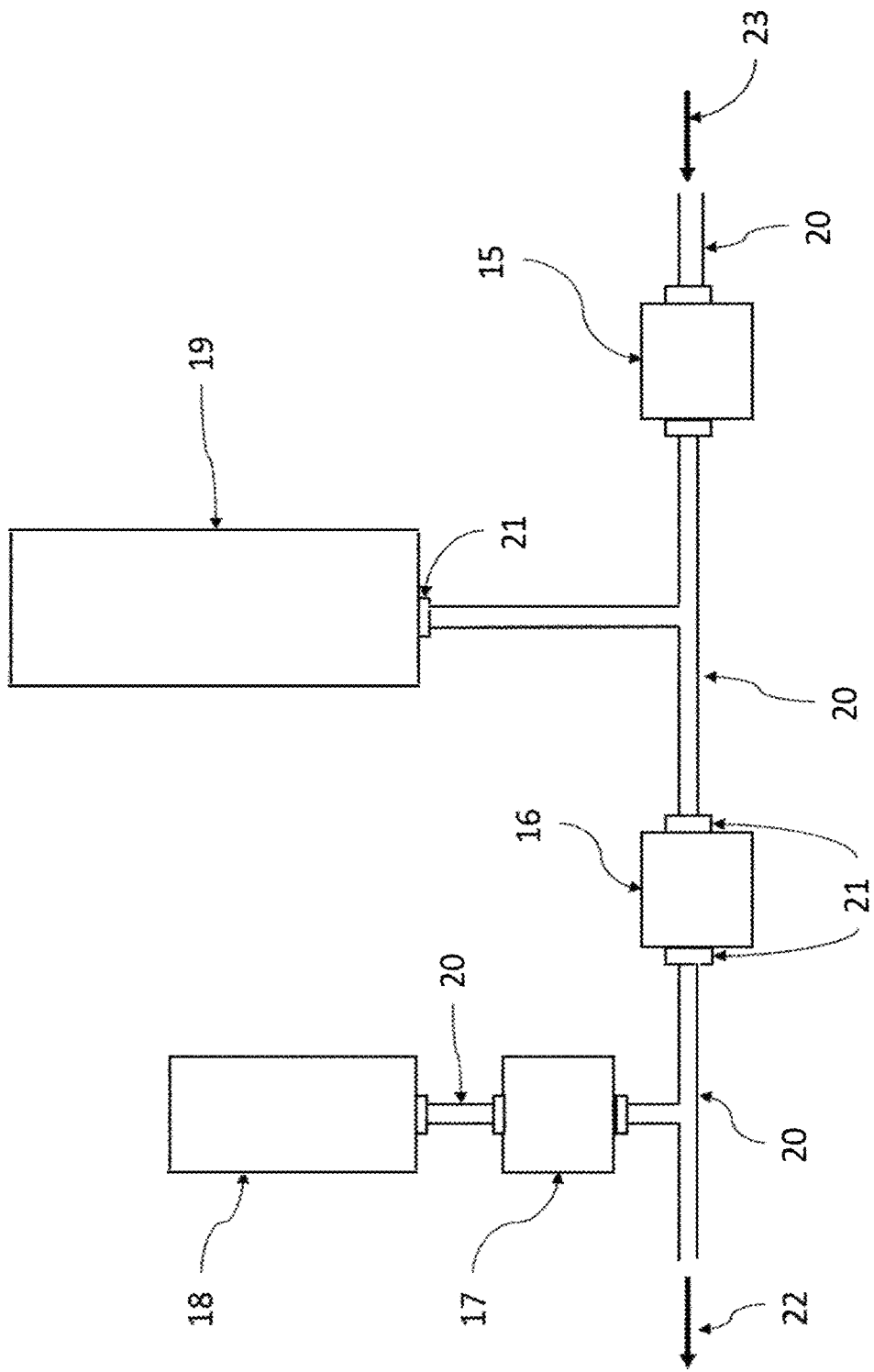
FIG. 2 is a schematic depiction of an assembly comprising separately formed freeze valves and transfer pipes.

FIG. 2 is a schematic depiction of an existing assembly for a liquid metal supply system used in an EUV light source. The assembly include a first freeze valve 15, a second freeze valve 16, and a third freeze valve 17. The assembly also includes a primary reservoir 18 and a refill reservoir 19, which are configured to receive a liquid metal. Connecting the freeze valves 15, 16, 17, the primary reservoir 18, and the refill reservoir 19 are separately formed transfer pipes 20. At the junction of the transfer pipes 20 and freeze valves 15, 16, 17, the primary reservoir 18, and the refill reservoir 19 are connections 21. As can be seen from the schematic depiction, there is a high number of connections 21 (not all of which are numbered), which are susceptible to leakage. The assembly includes an output 22 to a nozzle supply system (not shown), which ultimately forms droplets of liquid metal for the generation of radiation of a desired wavelength. The assembly also includes an input 23 from a priming system, which is configured to produce a liquid target material from solid matter.

Figure 3:
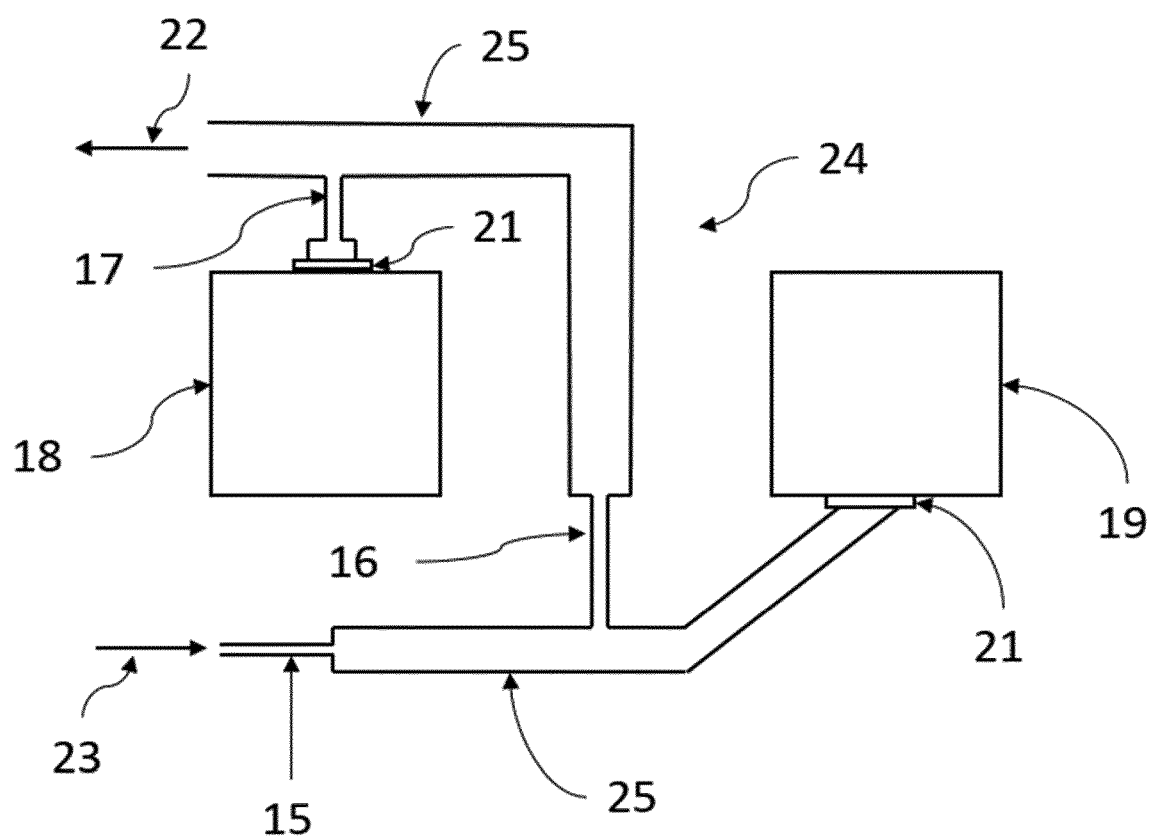
FIG. 3 is a schematic depiction of an assembly according to the present invention.

FIG. 3 is a schematic depiction of a connection assembly 24 according to an embodiment of the present invention. Whilst the primary reservoir 18 and refill reservoir 19 are depicted, they do not necessarily form a part of the apparatus of the present invention. In addition, the geometry of the schematic depiction is not intended to indicate a specific geometry and other geometries are possible. The connection assembly 24 comprises a first freeze valve 15, a second freeze valve 16 and an optional third freeze valve 17. It will be appreciated that in some embodiments, there is no third freeze valve 17. As depicted, the first, second, and third freeze valves 15, 16, 17 are connected by interior passages 25. The freeze valves 15, 16, 17 are formed integrally with the interior passages 25 and so the number of connections which are liable to leakage is reduced. With the depicted embodiment, there are four connections, namely one (not shown) between the liquid metal input 23 from a priming assembly to the first freeze valve 15, one connection 21 between the refill reservoir 19 and the interior passage 25 connecting to the first freeze valve 15 and the second freeze valve 16, one connection 21 between the primary reservoir 18 and the optional third freeze valve 17, and one (not shown) between the interior passage 25 and the liquid metal output 22 to the nozzle supply system. In contrast, an assembly having separately formed transfer pipes would have more than double the number of connections.

The connection assembly 24 may be manufactured using additive manufacturing, also referred to as 3D printing. This allows for the manufacture of a unitary body with the desired internal features, such as the freeze valves and interior passages. The connection assembly 24 may be manufactured from a billet. The interior passages and freeze valves may be manufactured via drilling. Whilst drilling may require the presence of additional holes in the billet to create the required interior features, such additional holes can be plugged and sealed. There may be a plug or a cap provided which is configured to seal any holes within the exterior of the monolithic block. The plug or cap can comprise any suitable material, although it is preferred that the material is the same as that of the monolithic block.

The areas adjacent to the freeze valves 15, 16, 17 have a lower cross-sectional area than other areas of the monolithic block. The purpose of this is to control the transfer of thermal energy through the monolithic block from one freeze valve to another. In this way, the freeze valves can effectively be isolated from one another to allow more convenient control of the opening and closing of the freeze valves. Additionally or alternatively, there can be a reduction of the diameter of the interior passages.

The connection assembly 24 may include conditioning elements or units (not shown) in thermal communication with one or more freeze valves. One or more controllers (not shown) may also be provided to control the operation of the conditioning elements or units. Embodiments are set out in the following numbered clauses:

1. A connection assembly for a high-pressure liquid metal supply system used in an EUV light source comprising a monolithic block, wherein the monolithic block includes:
    at least one connection for connecting to a reservoir configured to hold liquid metal;
    interior passages configured to fluidly connect the at least one connection with at least two liquid metal outlets/inlets;
    at least two freeze valves configured to block a passage by solidifying liquid metal therein.
2. The assembly of clause 1, further comprising one or more thermal conditioning elements in thermal connection with the freeze valves.
3. The assembly of clause 2, wherein the one or more thermal conditioning elements include one or more cooling elements, and/or one or more heating elements in thermal connection with the freeze valves.
4. The assembly according to clause 2 or 3, wherein the assembly comprises one or more controllers configured to control the one or more thermal conditioning elements to selectively open or close the freeze valves.
5. The assembly according to any of clauses 2 to 4, wherein the one or more thermal conditioning elements are configured to locally cool each freeze valve to below the melting point of the metal therein and/or to heat each freeze valve to above the melting point of the metal therein.
6. The assembly according to any preceding clause, wherein the assembly is configured to operate at pressures of up to around 30 kpsi, preferably at pressures of at least around 3000 psi, preferably at least around 4000 psi.
7. The assembly according to any preceding clause, wherein each freeze valve is at least partially thermally isolated from the other freeze valve(s).
8. The assembly according to clause 7, wherein each freeze valve is at least partially thermally isolated from the other freeze valve(s) by a section of the block having a decreased cross-sectional area.
9. The assembly according to any preceding clause, wherein a first one of the at least two freeze valves is in fluid communication with one of the at least two liquid metal outlets/inlets configured to receive liquid metal, the first freeze valve being in fluid communication with the at least one connection for connecting to a reservoir configured to hold liquid metal, and the first freeze valve also being in fluid communication with a second one of the at least two freeze valves.
10. The assembly according to any preceding clause, wherein a second one of the at least two freeze valves is in fluid communication with the at least one connection configured to connect to a first liquid metal reservoir, a first of the at least two freeze valves, an optional third freeze valve, and one of the at least two liquid metal outlets/inlets configured to discharge liquid metal.
11. The assembly according to any preceding clause, wherein the assembly includes a third freeze valve in fluid communication with a second one of the at least two freeze valves, in fluid communication with a connection configured to connect to a second liquid metal reservoir, and in communication with an outlet of the at least two liquid metal outlets/inlets configured to discharge liquid metal.
12. The assembly of any preceding clause, wherein the assembly is formed from a material which is resistant to liquid tin, preferably wherein the material is molybdenum or a molybdenum alloy.

13. A liquid metal supply assembly for an EUV lithography apparatus or source including the assembly according to any preceding clause.

14. A lithography apparatus including an assembly according to any preceding clause.

15. Use of an assembly or apparatus according to any preceding clause in a lithographic apparatus or method.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An assembly comprising:
   at least one connection configured to connect to a reservoir that is configured to hold liquid metal;
   interior passages configured to fluidly connect the at least one connection with at least one liquid metal input and at least one liquid metal outlet; and
   at least two freeze valves configured to block a passage by solidifying liquid metal therein, and
   wherein the interior passages and the at least two freeze valves are integrally formed as a monolithic block.

2. The assembly of claim 1, further comprising one or more thermal conditioning elements in thermal connection with the freeze valves.

3. The assembly of claim 2, wherein the one or more thermal conditioning elements include one or more cooling elements, and/or one or more heating elements in thermal connection with the freeze valves.

4. The assembly of claim 2, further comprising one or more controllers configured to control the one or more thermal conditioning elements to selectively open or close the freeze valves.

5. The assembly of claim 2, wherein the one or more thermal conditioning elements are configured to locally cool each freeze valve to below the melting point of the metal therein and/or to heat each freeze valve to above the melting point of the metal therein.

6. The assembly of claim 1, wherein the assembly is configured to operate at pressures of up to around 30 kpsi or at pressures of at least around 3000 psi or at least around 4000 psi.

7. The assembly of claim 1, wherein each freeze valve is at least partially thermally isolated from the other freeze valve(s).

8. The assembly of claim 7, wherein each freeze valve is at least partially thermally isolated from the other freeze valve(s) by a section of the monolithic block having a decreased cross-sectional area.

9. The assembly of claim 1, wherein:
   a first one of the at least two freeze valves is in fluid communication with one of the at least two liquid metal outlets/inlets configured to receive liquid metal,
   the first freeze valve is in fluid communication with the at least one connection for connecting to a reservoir configured to hold liquid metal, and
   the first freeze valve is also in fluid communication with a second one of the at least two freeze valves.

10. The assembly of claim 1, wherein:
    a second one of the at least two freeze valves is in fluid communication with the at least one connection configured to connect to a first liquid metal reservoir, and
    a first one of the at least two freeze valves, an optional third freeze valve, and one of the at least two liquid metal outlets/inlets are configured to discharge liquid metal.

11. The assembly of claim 1, further comprising:
    a third freeze valve in fluid communication with a second one of the at least two freeze valves, in fluid communication with a connection configured to connect to a second liquid metal reservoir, and in communication with an outlet of the at least two liquid metal outlets/inlets configured to discharge liquid metal.

12. The assembly of claim 1, wherein the assembly is formed from a material which is resistant to liquid tin, molybdenum, or a molybdenum alloy.

13. A liquid metal supply assembly for an EUV lithography apparatus or source including the assembly of claim 1.

14. A lithography apparatus including the assembly of claim 1.

* * * * *